US006813293B2

(12) United States Patent
Johnson et al.

(10) Patent No.: US 6,813,293 B2
(45) Date of Patent: Nov. 2, 2004

(54) LONG WAVELENGTH VCSEL WITH TUNNEL JUNCTION, AND IMPLANT

(75) Inventors: Ralph H. Johnson, Murphy, TX (US); Tzu-Yu Wang, Maple Grove, MN (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/301,380

(22) Filed: Nov. 21, 2002

(65) Prior Publication Data

US 2004/0101009 A1 May 27, 2004

(51) Int. Cl.[7] ................................................. H01S 5/00

(52) U.S. Cl. ............................ 372/43; 372/44; 372/45; 372/46; 372/47; 372/48; 372/49; 372/50; 372/99

(58) Field of Search ................................ 372/43–50, 99

(56) References Cited

U.S. PATENT DOCUMENTS

| | | | |
|---|---|---|---|
| 4,317,085 A | 2/1982 | Burnham et al. | |
| 4,466,694 A | 8/1984 | MacDonald | |
| 4,660,207 A | 4/1987 | Svilans | |
| 4,675,058 A | 6/1987 | Plaster | |
| 4,784,722 A | 11/1988 | Liau et al. | |

(List continued on next page.)

FOREIGN PATENT DOCUMENTS

| | | |
|---|---|---|
| DE | 4240706 A1 | 6/1994 |
| EP | 0288184 A2 | 10/1988 |
| EP | 0776076 A1 | 5/1997 |
| JP | 60123084 | 1/1985 |
| JP | 02054981 | 2/1990 |
| JP | 5299779 | 11/1993 |
| WO | WO 98/57402 | 12/1998 |

OTHER PUBLICATIONS

Banwell et al., "VCSE Laser Transmitters for Parallel Data Links", *IEEE Journal of Quantum Electronics*, vol. 29, No. 2, Feb. 1993, pp. 635–644.

Bowers et al., "Fused Vertical Cavity Lasers With Oxide Aperture", Final report for MICRO project 96–042, Industrial Sponsor: Hewlett Packard, 4 pages, 1996–97.

Catchmark et al., "High Temperature CW Operation of Vertical Cavity Top Surface–Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83–120.

Choe, et al., "Lateral oxidation of AlAs layers at elevated water vapour pressure using a closed–chamber system," Letter to the Editor, Semiconductor Science Technology, 15, pp. L35–L38, Aug. 2000.

Choa et al., "High–Speed Modulation of Vertical–Cavity Surface–Emitting Lasers",*IEEE Photonics Technology Letter*, vol. 3, No. 8, Aug. 1991, pp. 697–699.

(List continued on next page.)

*Primary Examiner*—Tho Phan
*Assistant Examiner*—Delma R. Flores Ruiz
(74) *Attorney, Agent, or Firm*—Workman Nydegger

(57) ABSTRACT

A vertical cavity emitting laser (VCSEL) having a tunnel junction. The junction may be isolated with an implant into a top mirror and past the junction and p-layer. A trench around the VCSEL may result in reduced capacitance and more D.C. isolation of the junction. The implant may occur after the trench is made. Some implant may pass the trench to a bottom mirror. Additional isolation and current confinement may be provided with lateral oxidation of a layer below the junction. Internal trenches may be made from the top of the VCSEL vertically to an oxidizable layer below the junction. For further isolation, an open trench may be placed around a bonding pad and its bridge to the VCSEL and internal vertical trenches may be placed on the pad and its bridge down to the oxidizable layer.

63 Claims, 7 Drawing Sheets

U.S. PATENT DOCUMENTS

| | | | |
|---|---|---|---|
| 4,885,592 A | 12/1989 | Kofol et al. |
| 4,901,327 A | 2/1990 | Bradley |
| 4,943,970 A | 7/1990 | Bradley |
| 4,956,844 A | 9/1990 | Goodhue et al. |
| 5,031,187 A | 7/1991 | Orenstein et al. |
| 5,052,016 A | 9/1991 | Mahbobzadeh |
| 5,056,098 A | 10/1991 | Anthony et al. |
| 5,062,115 A | 10/1991 | Thornton |
| 5,068,869 A | 11/1991 | Wang et al. |
| 5,079,774 A | 1/1992 | Mendez et al. |
| 5,115,442 A | 5/1992 | Lee et al. |
| 5,117,469 A | 5/1992 | Cheung et al. |
| 5,140,605 A | 8/1992 | Paoli et al. |
| 5,157,537 A | 10/1992 | Rosenblatt et al. |
| 5,158,908 A | 10/1992 | Blonder et al. |
| 5,212,706 A | 5/1993 | Jain |
| 5,216,263 A | 6/1993 | Paoli |
| 5,216,680 A | 6/1993 | Magnusson et al. |
| 5,237,581 A | 8/1993 | Asada et al. |
| 5,245,622 A | 9/1993 | Jewell et al. |
| 5,258,990 A | 11/1993 | Olbright et al. |
| 5,262,360 A | 11/1993 | Holonyak, Jr. et al. |
| 5,285,466 A | 2/1994 | Tabatabaie |
| 5,293,392 A | 3/1994 | Shieh et al. |
| 5,317,170 A | 5/1994 | Paoli |
| 5,317,587 A | 5/1994 | Ackley et al. |
| 5,325,386 A | 6/1994 | Jewell et al. |
| 5,331,654 A | 7/1994 | Jewell et al. |
| 5,337,074 A | 8/1994 | Thornton |
| 5,337,183 A | 8/1994 | Rosenblatt et al. |
| 5,349,599 A | 9/1994 | Larkins |
| 5,351,256 A | 9/1994 | Schneider et al. |
| 5,359,447 A | 10/1994 | Hahn et al. |
| 5,359,618 A | 10/1994 | Lebby et al. |
| 5,363,397 A | 11/1994 | Collins et al. |
| 5,373,520 A | 12/1994 | Shoji et al. |
| 5,373,522 A | 12/1994 | Holonyak, Jr. et al. |
| 5,376,580 A | 12/1994 | Kish et al. |
| 5,386,426 A | 1/1995 | Stephens |
| 5,390,209 A | 2/1995 | Vakhshoori |
| 5,396,508 A | 3/1995 | Bour et al. |
| 5,404,373 A | 4/1995 | Cheng |
| 5,412,678 A | 5/1995 | Treat et al. |
| 5,412,680 A | 5/1995 | Swirhun et al. |
| 5,416,044 A | 5/1995 | Chino et al. |
| 5,428,634 A | 6/1995 | Bryan et al. |
| 5,438,584 A | 8/1995 | Paoli et al. |
| 5,446,754 A | 8/1995 | Jewell et al. |
| 5,465,263 A | 11/1995 | Bour et al. |
| 5,475,701 A | 12/1995 | Hibbs-Brenner |
| 5,493,577 A | 2/1996 | Choquette et al. |
| 5,497,390 A | 3/1996 | Tanaka et al. |
| 5,513,202 A | 4/1996 | Kobayashi et al. |
| 5,530,715 A | 6/1996 | Shieh et al. |
| 5,555,255 A | 9/1996 | Kock et al. |
| 5,557,626 A | 9/1996 | Grodinski et al. |
| 5,561,683 A | 10/1996 | Kwon |
| 5,567,980 A | 10/1996 | Holonyak, Jr. et al. |
| 5,568,498 A | 10/1996 | Nilsson |
| 5,568,499 A | * 10/1996 | Lear ............................ 372/45 |
| 5,574,738 A | 11/1996 | Morgan |
| 5,581,571 A | 12/1996 | Holonyak, Jr. et al. |
| 5,586,131 A | 12/1996 | Ono et al. |
| 5,590,145 A | 12/1996 | Nitta |
| 5,598,300 A | 1/1997 | Magnusson et al. |
| 5,606,572 A | 2/1997 | Swirhun et al. |
| 5,625,729 A | 4/1997 | Brown |
| 5,642,376 A | 6/1997 | Olbright et al. |
| 5,645,462 A | 7/1997 | Banno et al. |
| 5,646,978 A | 7/1997 | Klem et al. |
| 5,648,978 A | 7/1997 | Sakata |
| 5,679,963 A | 10/1997 | Klem et al. |
| 5,692,083 A | 11/1997 | Bennett |
| 5,696,023 A | 12/1997 | Holonyak, Jr. et al. |
| 5,699,373 A | 12/1997 | Uchida et al. |
| 5,712,188 A | 1/1998 | Chu et al. |
| 5,726,805 A | 3/1998 | Kaushik et al. |
| 5,727,013 A | 3/1998 | Botez et al. |
| 5,727,014 A | 3/1998 | Wang et al. |
| 5,774,487 A | 6/1998 | Morgan |
| 5,778,018 A | 7/1998 | Yoshikawa et al. |
| 5,781,575 A | 7/1998 | Nilsson |
| 5,784,399 A | 7/1998 | Sun |
| 5,790,733 A | 8/1998 | Smith et al. |
| 5,805,624 A | 9/1998 | Yang et al. |
| 5,818,066 A | 10/1998 | Duboz |
| 5,828,684 A | 10/1998 | Van de Walle |
| 5,838,705 A | 11/1998 | Shieh et al. |
| 5,838,715 A | 11/1998 | Corzine et al. |
| 5,892,784 A | 4/1999 | Tan et al. |
| 5,892,787 A | 4/1999 | Tan et al. |
| 5,896,408 A | 4/1999 | Corzine et al. |
| 5,901,166 A | 5/1999 | Nitta et al. |
| 5,903,588 A | 5/1999 | Guenter et al. |
| 5,903,589 A | 5/1999 | Jewell |
| 5,903,590 A | 5/1999 | Hadley et al. |
| 5,908,408 A | 6/1999 | McGary et al. |
| 5,936,266 A | 8/1999 | Holonyak, Jr. et al. |
| 5,940,422 A | 8/1999 | Johnson |
| 5,953,362 A | 9/1999 | Pamulapati et al. |
| 5,978,401 A | 11/1999 | Morgan |
| 5,978,408 A | 11/1999 | Thornton |
| 5,995,531 A | 11/1999 | Gaw et al. |
| 6,002,705 A | 12/1999 | Thornton |
| 6,008,675 A | 12/1999 | Handa |
| 6,014,395 A | 1/2000 | Jewell |
| 6,043,104 A | 3/2000 | Uchida et al. |
| 6,046,065 A | 4/2000 | Goldstein et al. |
| 6,052,398 A | 4/2000 | Brillouet et al. |
| 6,055,262 A | 4/2000 | Cox et al. |
| 6,060,743 A | 5/2000 | Sugiyama et al. |
| 6,078,601 A | 6/2000 | Smith |
| 6,086,263 A | 7/2000 | Selli et al. |
| 6,133,590 A | 10/2000 | Ashley et al. |
| 6,144,682 A | 11/2000 | Sun |
| 6,154,480 A | 11/2000 | Magnusson et al. |
| 6,185,241 B1 | 2/2001 | Sun |
| 6,191,890 B1 | 2/2001 | Baets et al. |
| 6,208,681 B1 | 3/2001 | Thornton |
| 6,212,312 B1 | 4/2001 | Grann et al. |
| 6,238,944 B1 | 5/2001 | Floyd |
| 6,269,109 B1 | 7/2001 | Jewell |
| 6,297,068 B1 | 10/2001 | Thornton |
| 6,302,596 B1 | 10/2001 | Cohen et al. |
| 6,339,496 B1 | 1/2002 | Koley et al. |
| 6,369,403 B1 | 4/2002 | Holonyak, Jr. |
| 6,372,533 B2 | 4/2002 | Jayaraman et al. |
| 6,392,257 B1 | 5/2002 | Ramdani et al. |
| 6,410,941 B1 | 6/2002 | Taylor et al. |
| 6,411,638 B1 | 6/2002 | Johnson et al. |
| 6,427,066 B1 | 7/2002 | Grube |
| 6,455,879 B1 | 9/2002 | Ashley et al. |
| 6,459,709 B1 | 10/2002 | Lo et al. |
| 6,459,713 B2 | 10/2002 | Jewell |
| 6,462,360 B1 | 10/2002 | Higgins, Jr. et al. |
| 6,472,694 B1 | 10/2002 | Wilson et al. |
| 6,477,285 B1 | 11/2002 | Shanley |
| 6,487,230 B1 | 11/2002 | Boucart et al. |
| 6,487,231 B1 | 11/2002 | Boucart et al. |
| 6,490,311 B1 | 12/2002 | Boucart et al. |
| 6,493,371 B1 | 12/2002 | Boucart et al. |

| | | | |
|---|---|---|---|
| 6,493,372 B1 | 12/2002 | Boucart et al. | |
| 6,493,373 B1 | 12/2002 | Boucart et al. | |
| 6,496,621 B1 | 12/2002 | Kathman et al. | |
| 6,498,358 B1 | 12/2002 | Lach et al. | |
| 6,501,973 B1 | 12/2002 | Foley et al. | |
| 6,515,308 B1 | 2/2003 | Kneissl et al. | |
| 6,535,541 B1 | 3/2003 | Boucart et al. | |
| 6,542,531 B2 | 4/2003 | Sirbu et al. | |
| 6,556,607 B1 * | 4/2003 | Jewell | 372/49 |
| 6,567,435 B1 | 5/2003 | Scott et al. | |
| 2001/0004414 A1 | 6/2001 | Kuhn et al. | |
| 2003/0072526 A1 | 4/2003 | Kathman et al. | |

OTHER PUBLICATIONS

Choquette et al., "High Single Mode Operation from Hybrid Ion Implanted/Selectively Oxidized VCSELs", 200 IEEE 17th Internationial Semiconductor Laser Conference, Monterrey, CA pp. 59–60.

Choquette et al, "Lithographically–Defined Gain Apertures Within Selecively Oxidized VCSELs", paper CtuL6, Conference on Lasers and Electro–Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Chua, et al., "Low–Threshold 1.57–$\mu$ m VC–SEL's Using Strain–Compensated Quantum Wells and Oxide/Metal Backmirror," IEEE Photonics Technology Letters, vol. 7, No. 5, pp. 444–446, May 1995.

Chua, et al., "Planar Laterally Oxidized Vertical–Cavity Lasers for Low–Threshold High–Density Top–Surface–Emitting Arrays," IEEE Photonics Technology Letters, vol. 9, No. 8, pp. 1060–1062, Aug. 1997.

Cox, J. A., et al., "Guided Mode Grating Resonant Filters for VCSEL Applications", *Proceedings of the SPIE*, The International Society for Optical Engineering, Diffractive and Holographic Device Technologies and Applications V, San Jose, California, Jan. 28–29, 1998, vol. 3291, pp. 70–71.

Farrier, Robert G., "Parametric control for wafer fabrication: New CIM Techniques for data analysis," Solid State Technology, pp. 99–105, Sep. 1997.

Fushimi, et al., "Degradation Mechanism in Carbon–doped GaAs Minority–carrier Injection Devices," 34th Annual IRPS Proceedings, Dallas, TX., Apr. 29–May 2, 1996, 8 pages.

G. G. Ortiz, et al., "Monolithic Integration of In0.2 GA0.8As Vertical Cavity Surface–Emitting Lasers with Resonance–Enhanced Quantum Well Photodetectors", *Electronics Letters*, vol. 32, No. 13, Jun. 20, 1996, pp. 1205–1207.

G. Shtengel et al., "High–Speed Vertical–Cavity Surface–Emitting Lasers", *Photon. Tech. Lett.*, vol. 5, No. 12, pp. 1359–1361 (Dec. 1993).

Geib, et al., "Comparison of Fabrication Approaches for Selectively Oxidized VCSEL Arrays," Proceedings of SPIE, vol. 3946, pp. 36–40, 2000.

Graf, Rudolph, *Modern Dictionary of Electronics*, 6th ed., Indiana: Howard W. Sams & Company, 1984, p. 694.

Guenter et al., "Reliability of Proton–Implanted VCSELs for Data Communications", Invited Paper, *SPIE*, vol. 2683, OE LASE 96: Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High–Power Single Mode Operation from Hybrid Ion Implanted/Selectively Oxidized VCSELs", 13th Annual Meeting IEEE Lasers and Electro–Optics Society 2000 Annual Meeting (LEOS 2000), Rio Grande, Puerto Rico, pp. 804–805.

Hawthorne, et al., "Reliability Study of 850 nm VCSELs for Data Communications," IEEE, pp. 1–11, May 1996.

Herrick, et al., "Highly reliable oxide VCSELs manufactured at HP/Agilent Technologies," Invited Paper, Proceedings of SPIE vol. 3946, pp. 14–19, 2000.

Hibbs–Brenner et al., "Performance, Uniformity and Yield of 850nm VCSELs Deposited by MOVPE", *IEEE Phot. Tech. Lett.*, vol. 8, No. 1, pp. 7–9, Jan. 1996.

Hideaki Saito, et al., "Controlling polarization of quantum–dot surface–emitting lasers by using structurally anisotropic self–assembled quantum dots," American Institute of Physics, Appl, Phys. Lett. 71 (5), pp. 590–592, Aug. 4, 1997.

Hornak et al., "Low–Termperature (10K–300K) Characterization of MOVPE–Grown Vertical–Cavity Surface–Emitting Lasers", *Photon. Tech. Lett.*, vol. 7, No. 10, pp. 1110–1112, Oct. 1995.

Huffaker et al., "Lasing Characteristics of Low Threshold Microcavity Layers Using Half–Wave Spacer Layers and Lateral Index Confinement", *Appl. Phys. Lett.*, vol. 66, No. 14, pp. 1723–1725, Apr. 3, 1995.

Jewell et al., "Surface Emitting Microlasers for Photonic Switching & Intership Connections", *Optical Engineering*, vol. 29, No. 3, pp. 210–214, Mar. 1990.

Jiang et al., "High–Frequency Polarization Self–Modulation in Vertical–Cavity Surface–Emitting Lasers", *Appl. Phys. Letters*, vol. 63, No. 26, Dec. 27, 1993, pp. 2545–2547.

K.L. Lear et al., "Selectively Oxidized Vertical Cavity Surface–Emitting Lasers with 50% Power Conversion Efficiency", *Elec. Lett.*, vol. 31, No. 3 pp. 208–209, Feb. 2, 1995.

Kash, et al., "Recombination in GaAs at the AIAs oxide–GaAs interface," Applied Physics Letters, vol. 67, No. 14, pp. 2022–2024, Oct. 2, 1995.

Kishino et al., "Resonant Cavity–Enhanced (RCE) Photodetectors", *IEEE Journal of Quantum Electronics*, vol. 27, No. 8, pp. 2025–2034.

Koley B., et al., "Dependence of lateral oxidation rate on thickness of AIAs layer of interest as a current aperture in vertical–cavity surface–emitting laser structures", Journal of Applied Physics, vol. 84, No. 1, pp. 600–605, Jul. 1, 1998.

Kuchibhotla et al., "Low–Voltage High Gain Resonant_Cavity Avalanche Photodiode", *IEEE Phototonics Technology Letters*, vol. 3, No. 4, pp. 354–356.

Lai et al., "Design of a Tunable GaAs/AlGaAs Multiple–Quantum–Well Resonant Cavity Photodetector", *IEEE Journal of Quantum Electronics*, vol. 30, No. 1, pp. 108–114.

Lee et al., "Top–Surface Emitting GaAs Four–Quantum–Well Lasers Emitting at 0–85 um", *Electronics Letters*, vol. 24, No. 11, May 24, 1990, pp. 710–711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251–1252.

Maeda, et al., "Enhanced Glide of Dislocations in GaAs Single Crystals by Electron Beam Irradiation," Japanese Journal of Applied Physics, vol. 20, No. 3, pp. L165–L168, Mar. 1981.

Magnusson, "Integration of Guided–Mode Resonance Filters and VCSELs", Electo–Optics Research Center, Department of Electrical Engineering, University of Texas at Arlington, May 6, 1997.

Martinsson et al., "Transverse Mode Selection in Large–Area Oxide–Confined Vertical–Cavity Surface–Emitting Lasers Using a Shallow Surface Relief", IEEE Photon. Technol. Lett., 11(12), 1536–1538 (1999).

Miller et al., "Optical Bistability Due to Increasing Absorption", Optics Letters, vol. 9, No. 5, May 1984, pp. 162–164.

Min Soo Park and Byung Tae Ahn, "Polarization control of vertical–cavity surface–emitting lasers by electro–optic birefringence," Applied Physics Letter, vol. 76, No. 7, pp. 813–815, Feb. 14, 2000.

Morgan et al., "200 C, 96–nm Wavelength Range, Continuous–Wave Lasing from Unbonded GaAs MOVPE–Grown Vertical Cavity Surface–Emitting Lasers", IEEE Photonics Technology Letters, vol. 7, No. 5, May 1995, pp. 441–443.

Morgan et al., "High–Power Coherently Coupled 8×8 Vertical Cavity Surface Emitting Laser Array", Appl. Phys Letters, vol. 61, No. 10, Sep. 7, 1992, pp. 1160–1162.

Morgan et al., "Hybrid Dielectric/AlGaAs Mirror Spatially Filtered Vertical Cavity Top–Surface Emitting Laser", Appl. Phys. Letters, vol. 66, No. 10, Mar. 6, 1995, pp. 1157–1159.

Morgan et al., "Novel Hibrid–DBR Single–Mode Controlled GaAs Top–Emitting VCSEL with Record Low Voltage", 2 pages, dated prior to Dec. 29, 2000.

Morgan et al., "One Watt Vertical Cavity Surface Emitting Laser", Electron. Lett., vol. 29, No. 2, pp. 206–207, Jan. 21, 1993.

Morgan et al., "Producible GaAs–based MOVPE–Grown Vertical–Cavity Top–Surface Emitting Lasers with Record Performance", Elec. Lett., vol. 31, No. 6, pp. 462–464, Mar. 16, 1995.

Morgan et al., "Progress and Properties of High–Power Coherent Vertical Cavity Surface Emitting Laser Arrays", SPIE, Vo. 1850, Jan. 1993, pp. 100–108.

Morgan et al., "Progress in Planarized Vertical Cavity Surface Emitting Laser Devices and Arrays", SPIE, vol. 1562, Jul. 1991, pp. 149–159.

Morgan et al., "Spatial–Filtered Vertical–Cavity Top Surface–Emitting Lasers", CLEO, 1993, pp. 138–139.

Morgan et al., "Submilliamp, Low–Resistance, Continuous–Wave, Single–Mode GaAs Planar Vertical–Cavity Surface Emitting Lasers", Honeywell Technology Center, Jun. 6, 1995.

Morgan et al., "Transverse Mode Control of Vertical–Cavity Top–Surface Emitting Lasers", IEEE Photonics Technology Letters, vol. 4, No. 4, Apr. 1993, pp. 374–377.

Morgan et al., "Vertical–cavity surface–emitting laser arrays", Invited Paper, SPIE, vol. 2398, Feb. 6, 1995, pp. 65–93.

Morgan et al., Vertical–cavity surface emitting lasers come of age, Invited paper, SPIE, vol. 2683, 0–8194–2057, Mar. 1996, pp. 18–29.

Morgan, "High–Performance, Producible Vertical Cavity Lasers for Optical Interconnects", High Speed Electronics and Systems, vol. 5, No. 4, Dec. 1994, pp. 65–95.

Naone R.L., et al., "Tapered–apertures for high–efficiency miniature VCSELs", LEOS newsletter, vol. 13, No. 4, pp. 1–5, Aug. 1999.

Nugent et al., "Self–Pulsations in Vertical–Cavity Surface–Emitting Lasers", Electronic Letters, vol. 31, No. 1, Jan. 5, 1995, pp. 43–44.

Oh, T. H. et al., "Single–Mode Operation in Antiguided Vertical–Cavity Surface–Emitting Laser Using a Low–Temperature Grown AlGaAs Dielectric Aperture", IEEE Photon. Technol. Lett, 10(8), 1064–1066 (1998).

Osinski, et al., "Temperature and Thickness Dependence of Steam Oxidation of AIAs in Cylindrical Mesa Structure," IEEE Photonics Technology Letters, vol. 13, No. 7, pp. 687–689, Jul. 2001.

Peck, D. Stewart, Comprehensive Model for Humidity Testing Correlation, IEEE/IRPS, pp. 44–50, 1986.

Ries, et al., "Visible–spectrum ($\lambda$ =650nm) photopumped (pulsed, 300 K) laser operation of a vertical–cavity AIAs–AIGaAs/InAIP–InGaP quantum well heterostructure utilizing native oxide mirrors," Applied Physics Letters, vol. 67, No. 8, pp. 1107–1109, Aug. 21, 1995.

S.S. Wang and R. Magnusson, "Multilayer Waveguide–Grating Filters", Appl. Opt., vol. 34, No. 14, pp. 2414–2420, 1995.

S.S. Wang and R. Magnusson, "Theory and Applications of Guided–Mode Resonance Filters", Appl. Opt., vol. 32, No. 14, pp. 2606–2613, 1993.

Sah, et al., "Carrier Generation and Recombination in P–N Junctions and P–N Junction Characteristics," Proceedings of the IRE, pp. 1228–1243, Sep., 1957.

Schubert, "Resonant Cavity Light–Emitting Diode", Appl. Phys. Lett., vol. 60, No. 8, pp. 921–923, Feb. 24, 1992.

Shi, et al., "Photoluminescence study of hydrogenated aluminum oxide–semiconductor interface,"Applied Physics Letters, vol. 70, No. 10, pp. 1293–1295, Mar. 10, 1997.

Smith, R.E. et al., Polarization–Sensitive Subwavelength Antireflection Surfaces on a Semiconductor for 975 NM, Optics Letters, vol. 21, No. 15, Aug. 1, 1996, pp. 1201–1203.

Spicer, et al., "The Unified Model For Schottky Barrier Formation and MOS Interface States in 3–5 Compounds," Applications of Surface Science, vol. 9, pp. 83–01, 1981.

Suning Tang et al., "Design Limitations of Highly Parallel Free–Space Optical Interconnects Based on Arrays of Vertical Cavity Surface–Emitting Laser Diodes, Microlenses, and Photodetectors", Journal of Lightwave Technology, vol. 12, No. 11, Nov. 1, 1994, pp. 1971–1975.

T. Mukaihara, "Polarization Control of Vertical–cavity Surface–Emitting Lasers by a Birefringent Metal/Semiconductor Polarizer Terminating a Distributed Bragg Reflector," Tokyo Institute of Technology, Precision and Inteligence Laboratory, pp. 183–184.

Tao, Andrea, "Wet–Oxidation of Digitally Alloyed AIGaAs," National Nanofabrication Users Network, Research Experience for Undergraduates 2000, 2 pages.

Tautm, et al., Commerialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface–Emitting Lasers," Japan J. Appl. Phys. vol. 33 (1994) pp. L227–L229, Part 2, No. 2B, Feb. 15, 1994.

Tu, Li–Wei et al., "Transparent conductive metal–oxide contacts in vertical–injection top–emitting quantum well lasers", Appl. Phys. Lett. 58 (8) Feb. 25, 1991, pp. 790–792.

Wieder, H.H., "Fermi level and surface barrier of $Ga_xIn_{1-x}$ As alloys," Applied Physics Letters, vol. 38, No. 3, pp. 170–171, Feb. 1, 1981.

Wipiejewski, et al., "VCSELs for datacom applications," Invited Paper, Part of the SPIE Conference on Vertical–Cavity Surface–Emitting Lasers III, San Jose, California, SPIE vol. 3627, pp. 14–22, Jan. 1999.

Y. M. Yang et al., "Ultralow Threshold Current Vertical Cavity Surface Emitting Lasers Obtained with Selective Oxidation", Elect. Lett., vol. 31, No. 11, pp. 886–888, May 25, 1995.

Yablonovitch et al., "Photonic Bandgap Structures", J. Opt. Soc. Am. B., vol. 10, No. 2, pp. 283–295, Feb. 1993.

Young et al., "Enhanced Performance of Offset–Gain High Barrier Vertical–Cavity Surface–Emitting Lasers", IEEE J. Quantum Electron., vol. 29, No. 6, pp. 2013–2022, Jun. 1993.

U.S. patent application Ser. No. 09/751,422, filed Dec. 29, 2000, entitled "Resonant Reflector for Use with Optoelectronic Devices".

U.S. patent application Ser. No. 09/751,423, filed Dec. 29, 200, entitled "Spatially Modulated Reflector for an Optoelectronic Device".

U.S. patent application Publication, Publication No. US 2002/0154675 A1, entitled "Reliability–Enhancing Layers for Vertical Cavity Surface Emitting Lasers", Publication date Oct. 24, 2002.

* cited by examiner

LONG WAVELENGTH VCSEL WITH TUNNEL JUNCTION, AND IMPLANT

BACKGROUND

The present invention pertains to vertical cavity surface emitting lasers (VCSELs) and particularly to tunnel junction VCSELs having long wavelengths, namely, 1200 to 1800 nanometer wavelengths.

A long wavelength VCSEL having a tunnel junction and a thick mirror layer is difficult to isolate because of the high doping used in the tunnel junction. Island isolation or trenches can provide direct current (D.C.) isolation for such VCSELs. To reduce capacitance of the VCSEL an implant needs to be used; however, it will not adequately compensate the tunnel junction. Because the implant can go deeper than the tunnel junction into the p region and down to the active region it can form an insulating region under the tunnel junction which reduces the capacitance. Some VCSEL isolation is shown in U.S. Pat. No. 5,903,588. U.S. Pat. No. 5,903,588 issued May 11, 1999, and entitled "Laser with a Selectively Changed Current Confining Layer," is expressly incorporated herein by reference into this description.

SUMMARY

An isolation implant used for isolation of a VCSEL should go through and past the tunnel junction of the VCSEL into and optimally through the p layer. This implant results in a semi-insulating region that reduces capacitance under the tunnel junction. Internal trenches about the VCSEL aperture can be utilized to reduce a required oxidation distance and thus reduce variability of the aperture diameter.

DESCRIPTION

Figure 1:
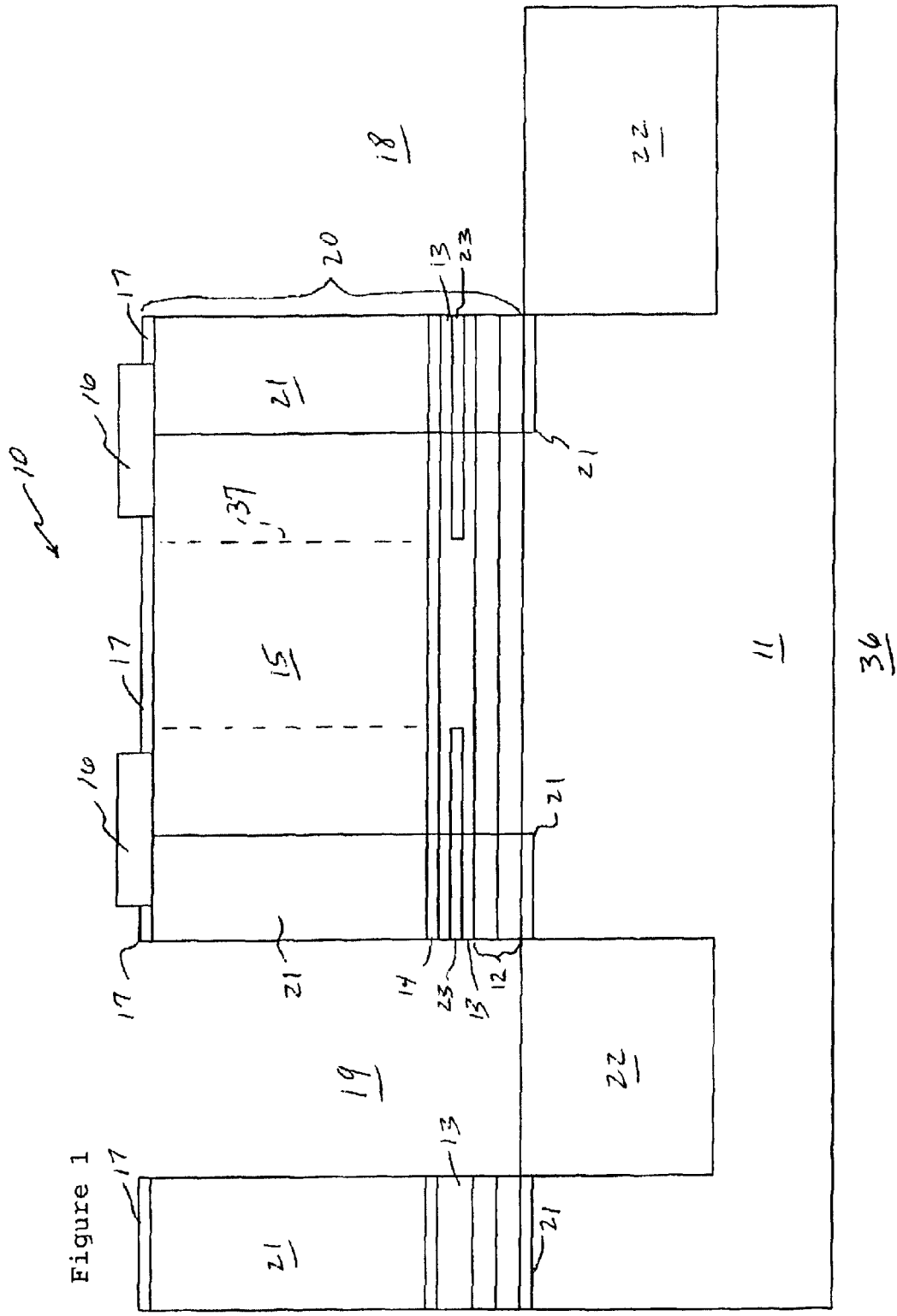
FIG. 1 shows a cross-section of a VCSEL having tunnel junction, with implant and island or trench isolation.

The Figures are for illustrative purposes and not necessarily drawn to scale. FIG. 1 shows a manufacturable structure of a VCSEL having deep implant isolation. A VCSEL that emits light having a 1200 to 1800 nanometer (nm) wavelength is described, though the same structures and techniques adjusted for the wavelength are advantageous for other wavelength VCSELs such as 850 nm, 980 nm or 660 nm VCSELs. On a substrate 36 a distributed Bragg reflector N-mirror 11 is situated. Mirror 11 may be composed of 30 to 50 pairs of layers. Each layer of the pair is about one-fourth of the optical design wavelength ($\lambda$) of light to be emitted by the VCSEL. Each pair of layers may be InGaAsP and InP, AlGaAsSb and InP, or AlGaPSb and InP, respectively, for a 1550 nm InP VCSEL. These layers are lattice matched to InP and may or may not be fully N-doped. They may be partially doped for the intra-cavity type of device. An active region 12 having InAlGaAs strained quantum wells and InAlAs barriers, also of a strained composition, is on mirror 11. Active region 12 is not doped or is unintentionally doped. An oxidizable layer(s) or region 13 is on active region 12. Layer(s) 13 has InAlAs material. The composition of layer 13 may be high in Al content and thus easily oxidizable. Another kind of oxidizable material may be present in layer 13. Lateral oxidation regions 23 are made and extend to the periphery of the inside aperture of current confinement. The material of region 13 may or may not be lattice matched. Region 13 is P-doped. A tunnel junction 14 may be on region 13. This junction 14 has a highly doped P material adjacent (~1e20/cm3) to a highly doped N material (~3e19/cm3) that results in the junction. The materials may include InAlGaAs and InP. Another distributed Bragg reflector N-mirror 15 is on tunnel junction 14. It may have about 35 pairs of layers of InGaAsP and InP, InAlGaAs and InP or InAlGaAs and InAlAs. These layers of mirror 15 may be lattice material to InP.

A 1310 nm VCSEL 10 may be a GaAs substrate based device. On an appropriate substrate 36 may be an N mirror 11 having from 25 to 40 pairs of layers of AlGaAs and GaAs or AlAs and GaAs, respectively. These materials are lattice matched and may or may not be fully N-doped. They may be partially doped for the intra-cavity type of device. On mirror 11 is an active region 12 having quantum wells and barriers. There may be one to five quantum wells. There may be included in active region 12 a spacer layer above or below the quantum wells to extend the cavity multiples of half wavelengths. The spacer may have periodic doping peaked at the nulls of the optical field. The material of active region 12 may include quantum wells of InGaAsN or InGaAsNSb, barrier layers of GaAs or GaAsN, GaAsSbN or a combination thereof, and confining layers of GaAs, AlGaAs, GaAsP or some combination thereof. The quantum wells of region 12 are not doped or may be unintentionally doped. On region 12 may be a region 13 having a partially oxidized layer that extends inward up to the periphery of where the current of an operating VCSEL 10 may be confined is centered on the null of the electric field. The material may include AlGaAs which has a high proportion of Al for lateral oxidation of the region. The material may be lattice matched and P-doped. On region 13 is a tunnel junction 14 having highly doped P and N materials adjacent to each other to form a junction. The materials may be GaAs, AlGaAs or InGaAs. They may be or may not be lattice matched. On tunnel junction 14 is an N mirror 15. Mirror 15 may have 16 to 25 pairs of layers of AlGaAs and GaAs and may contain a spacer which is a multiple of half wavelengths thick which may be periodically doped.

A 1550 nm VCSEL 10 may be a GaAs substrate based device. The material structure of this VCSEL may be the same as that of the 1310 nm GaAs VCSEL. The content distribution of the various materials may vary from one illustrative embodiment to another.

VCSEL 10 of FIG. 1 may be structured as an island with volume 18 of material removed or with a trench 19 around it or at least partially around it. Both types of structures are illustrated on the right and left sides, respectively, of FIG. 1. Island 20 is formed by the removal of material from volume 18. Island 20 or trench 19 is around at least active region 12 of VCSEL 10 and may provide tunnel junction 14 with D.C. isolation. Island 20 or trench 19 may be used as an entry or source for lateral oxidation 23 to provide added isolation.

Oxidation trenches 23 provide current confinement and thus may reduce variability in the diameter of the aperture. However, to obtain low capacitance, an isolation implant of volumes 21 and 22 may be utilized. Implants 21 and 22 are of sufficient depth to create a semi-insulating isolation to reduce the capacitance between tunnel junction 14 and the substrate. Buried implant 21 may go down through tunnel junction 14 and through a region including tunnel junction 14 and the quantum wells of active region 12. The implant may be through more layers or regions, including down past active region 12. Implant species may include $H^+$ ions, $D^+$ ions or $He^{++}$ ions. The energy range of an implant may be between 35 KeV and 2000 KeV. The energy dose of the implanting may be between 1E14 and 5E16 atoms/cm$^2$ and is optimally about 7E14 atoms/cm3.

Figure 2:
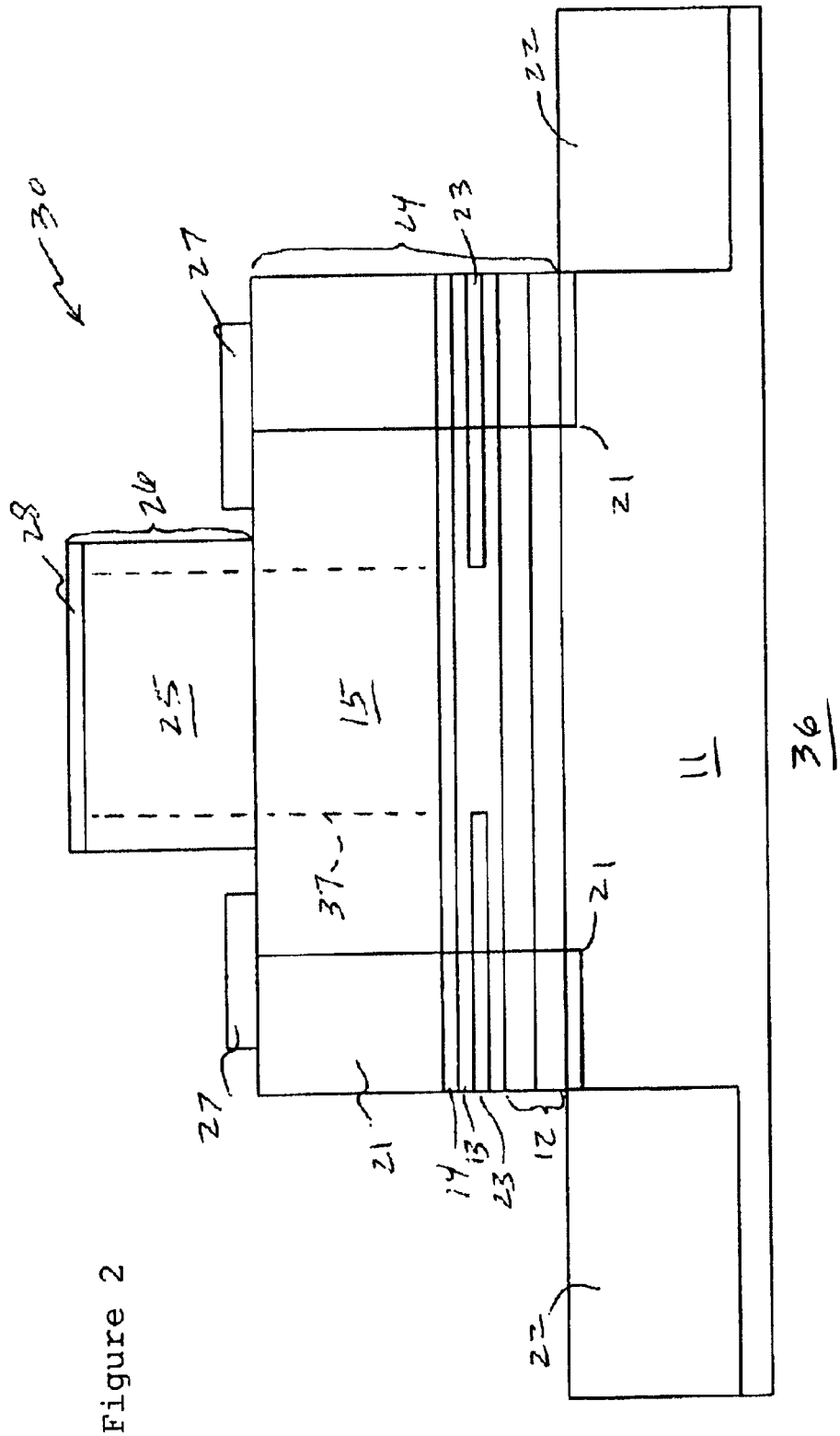
FIG. 2 shows a cross-section of another configuration of a tunnel junction VCSEL.

FIG. 2 shows a VCSEL 30 having an upper mirror structure different than that of VCSEL 10. However, VCSEL 30 may have a spacer in the active region and/or one of the mirrors as in VCSEL 10 noted above. Like VCSEL 10, VCSEL 30 has an N mirror 11 on a substrate 36 and an active region 12 on mirror 11. On active region 12 is an oxidation region 13 with lateral oxidized trenches 23. Oxidation region 13 is p-doped. On region 13 is tunnel junction 14. Up to this point, the material and numbers of pairs of layers may be the same as those of VCSEL 10. But upper N-mirror 15 may have a stack of 11 pairs of layers at a maximum. Yet, the materials of these layers may be the same as those of mirror 15 of VCSEL 10. From the top of mirror 11 up to the top of mirror 15, that structure may be an island 24. On top of mirror 15 is a mirror structure 25 that is an extension of mirror 15. It is an island 26 relative to the top of mirror 15. Around island 26 may be a contact 27 on top of mirror 15. It is regarded as a "recessed contact" in that the distance from the top of mirror 15 to tunnel junction 14 is less than the distance between mirror 15 and junction 14 of VCSEL 10. For a reduced energy of implantation of ions in VCSEL 10, implant 21 can reach down into active layer 12. Implant 22 may be situated in a portion of mirror 11 about or outside the perimeter of island 24. One may do the same depth implant into or past active region 12 in VCSEL 10 as in VCSEL 30 with more energy but availability of implanters with sufficient energy may be a problem.

A distinguishing feature between VCSEL 10 and VCSEL 30 is the shorter mirror 15 with a dielectric mirror 25 stack or island 26 on mirror 15 of island 24. Mirror 25 may have 3 to 4 pairs of $TiO_2$ and $SiO_2$, 2 to 3 pairs of Si and $SiO_2$, 2 to 3 pairs of Si and $Al_2O_3$, or 4 to 5 pairs of $TiO_2$ and $Al_2O_3$, respectively.

On top of mirror 15 of VCSEL 10 is a contact 16 and the rest of the top surface of mirror 15 has a layer 17 of dielectric such as, for example, $SiO_2$. On the top of mirror 15 of VCSEL 30 is contact 27 and mirror 25, as noted above. A layer 28 of dielectric on stack 25 may be, for example, $SiO_2$. Another contact may be at the bottom of substrate 36 but may be brought up to be connectable from the top of the respective VCSEL 10 or 30. In both VCSELs, the dielectric may cover light aperture 37 and not block the emitted light.

Figure 3A:
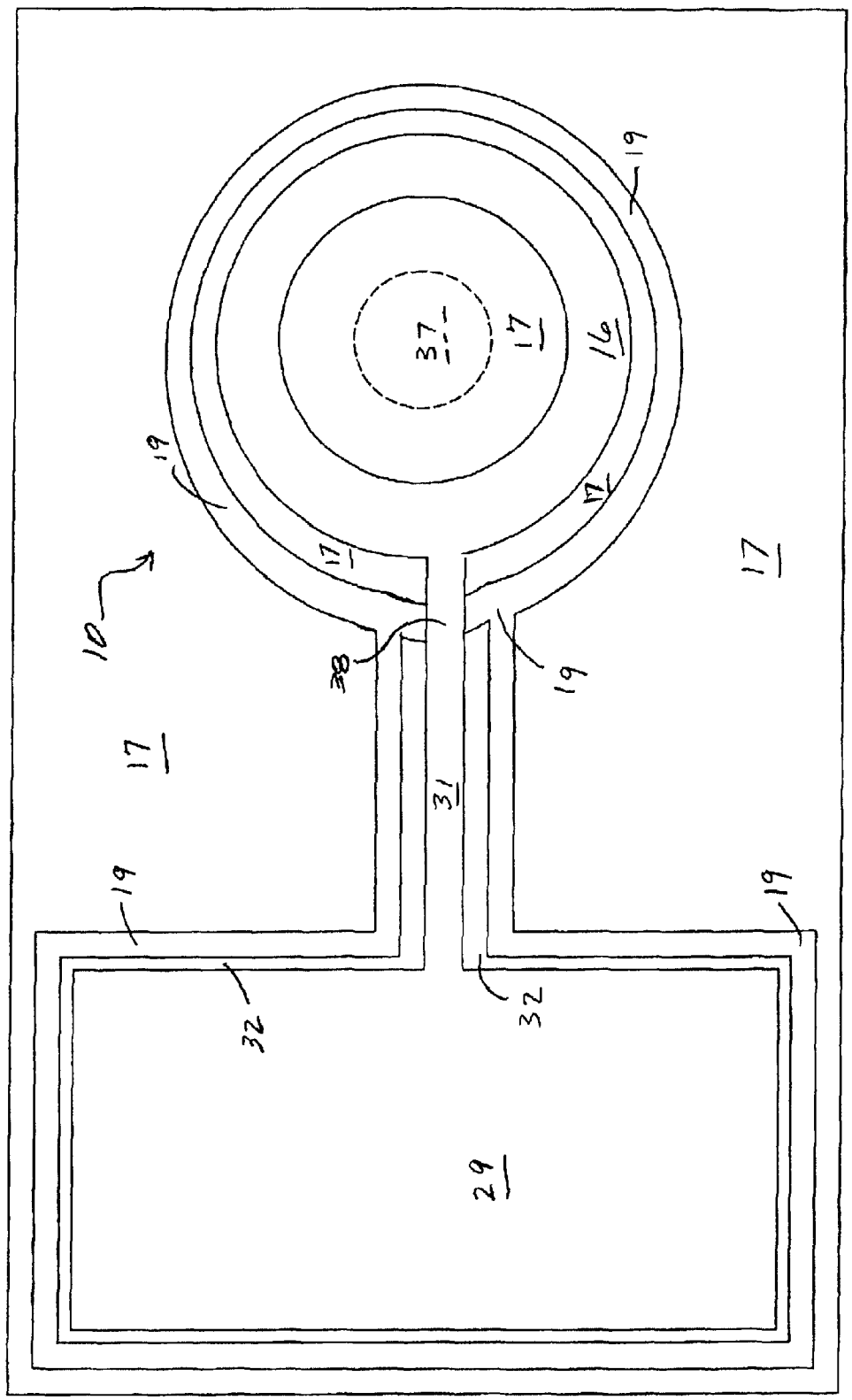
FIG. 3a reveals a layout having a trench around a VCSEL including a bond pad and its connecting bridge to the VCSEL.
Figure 3B:
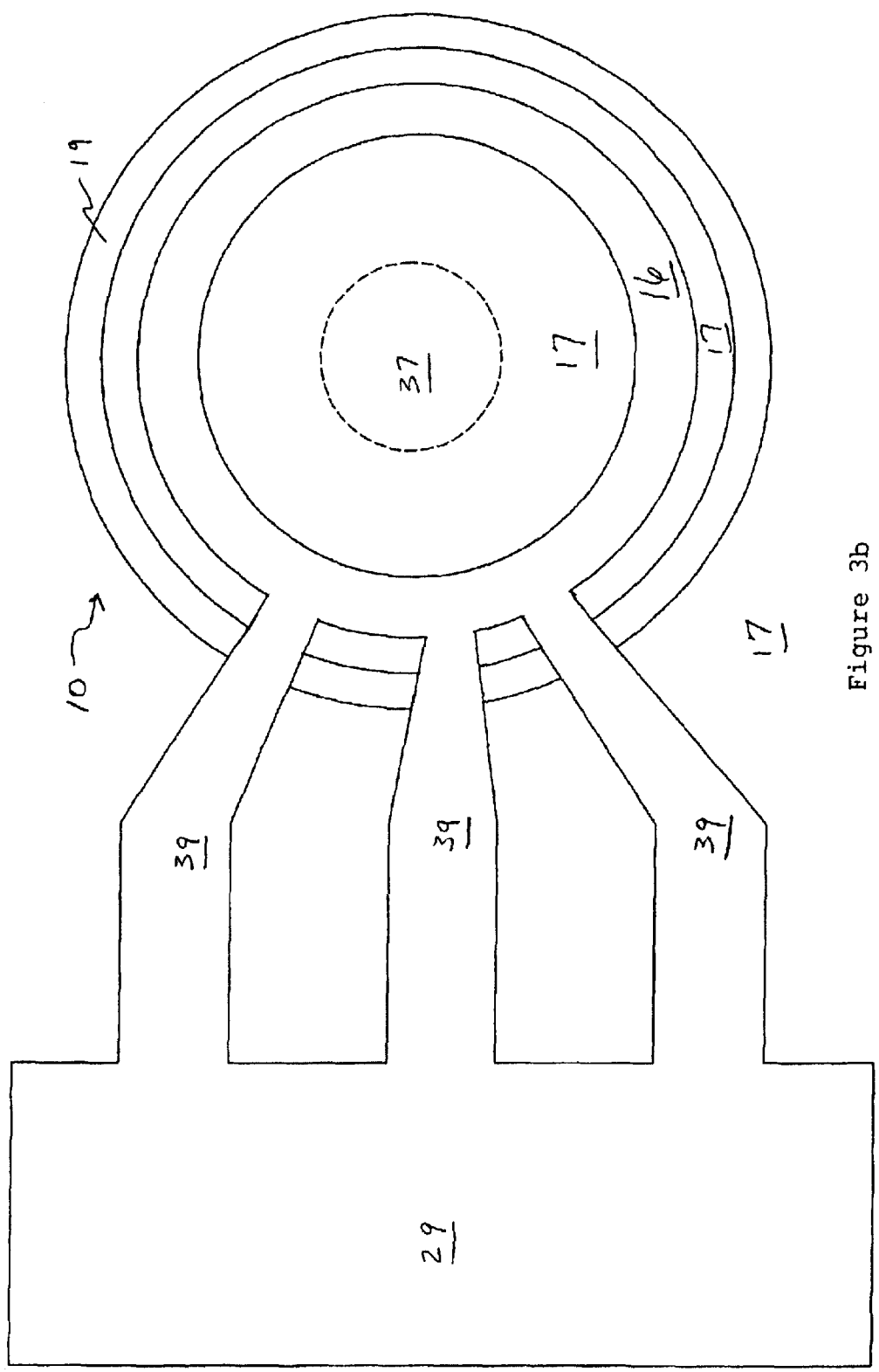
FIG. 3b shows a bond pad having several bridges connecting it to the VCSEL.

FIG. 3a shows VCSEL 10 having a bonding pad 29 and bridging connection 31. Even though each of FIGS. 3a, 3b and 5 shows a VCSEL device with a bridge, device 10 or 30 may be made without bridging between the bond pad and the device by taking advantage of the buried implant that goes at least through and under the tunnel junction, but which may be also elsewhere in the chip. Trench 19 in FIG. 3a goes around VCSEL 10 and under bridge 31 at an area 38 close to its connection with contact 16. Bridge 31, at area 38 over trench 19, may be an air bridge which might be made with the removal of sacrificial material beneath it, or it may be on a planarization layer, or have a trench filling under it or it may be electroplated with a patterned electroplating technique. Around and under bonding pad 29 and its connecting bridge 31 to contact 16 may be a dielectric 32. Dielectric 32 may be contiguous with dielectric 17 of VCSEL 10. Dielectric 17 is situated over VCSEL 10 light aperture 37. Dielectric 32 might not be used in this pad 29 configuration. Trench 19 goes around pad 29 and along the sides of bridge 31, but on the periphery of dielectric 32 if pad 29 utilizes a dielectric. The dielectric may provide both reduced capacitance and D.C. isolation of the VCSEL. VCSEL 10 of FIG. 3a may have interior trenches like those of VCSEL 10 in FIG. 4a.

FIG. 3b shows VCSEL 10 having several bridges 39 connecting bonding pad 29 to contact 16. VCSEL 10 of this Figure may have interior trenches like trenches 33 of VCSEL 10 in FIG. 4a as described below. VCSEL 10 of FIG. 3b may also have a trench at least around a portion of its perimeter.

Figure 4A:
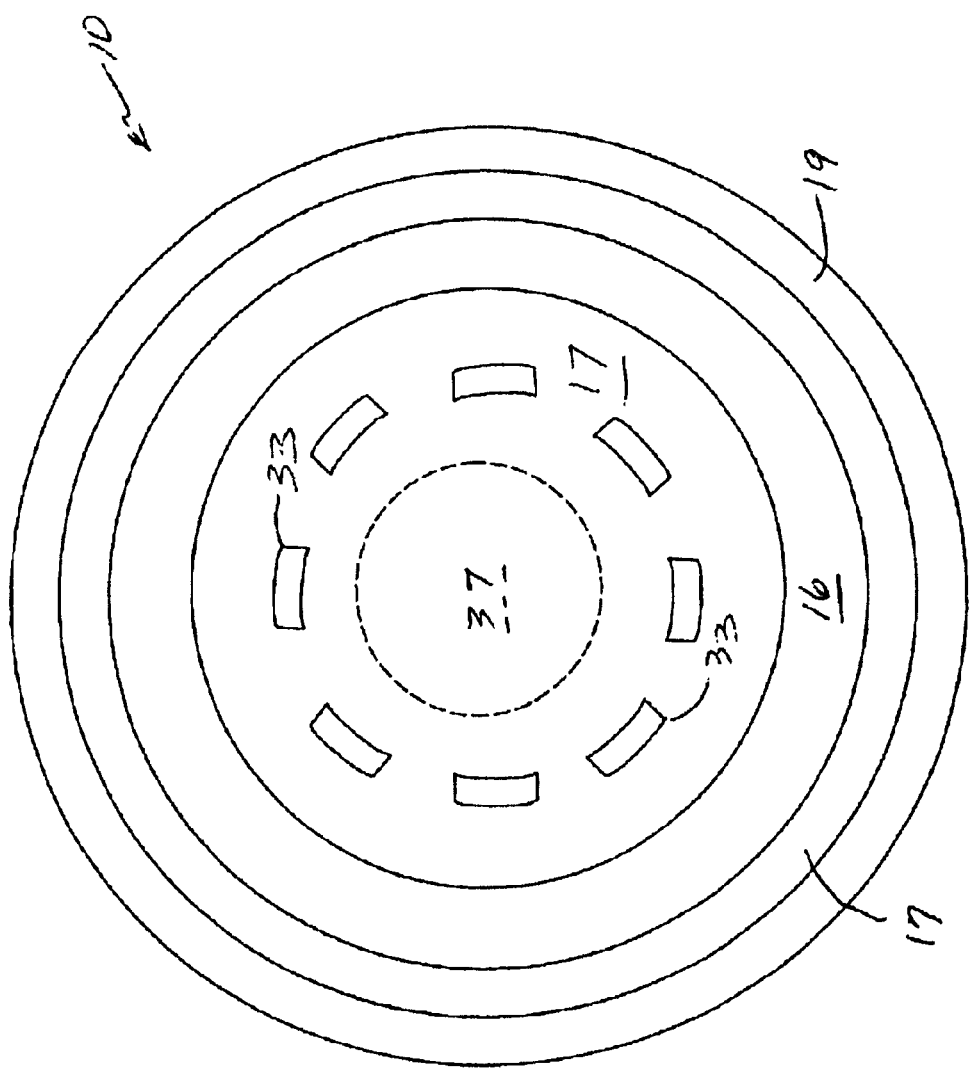
FIG. 4a reveals interior trenches on the VCSEL device for reducing a required oxidation distance.
Figure 4B:
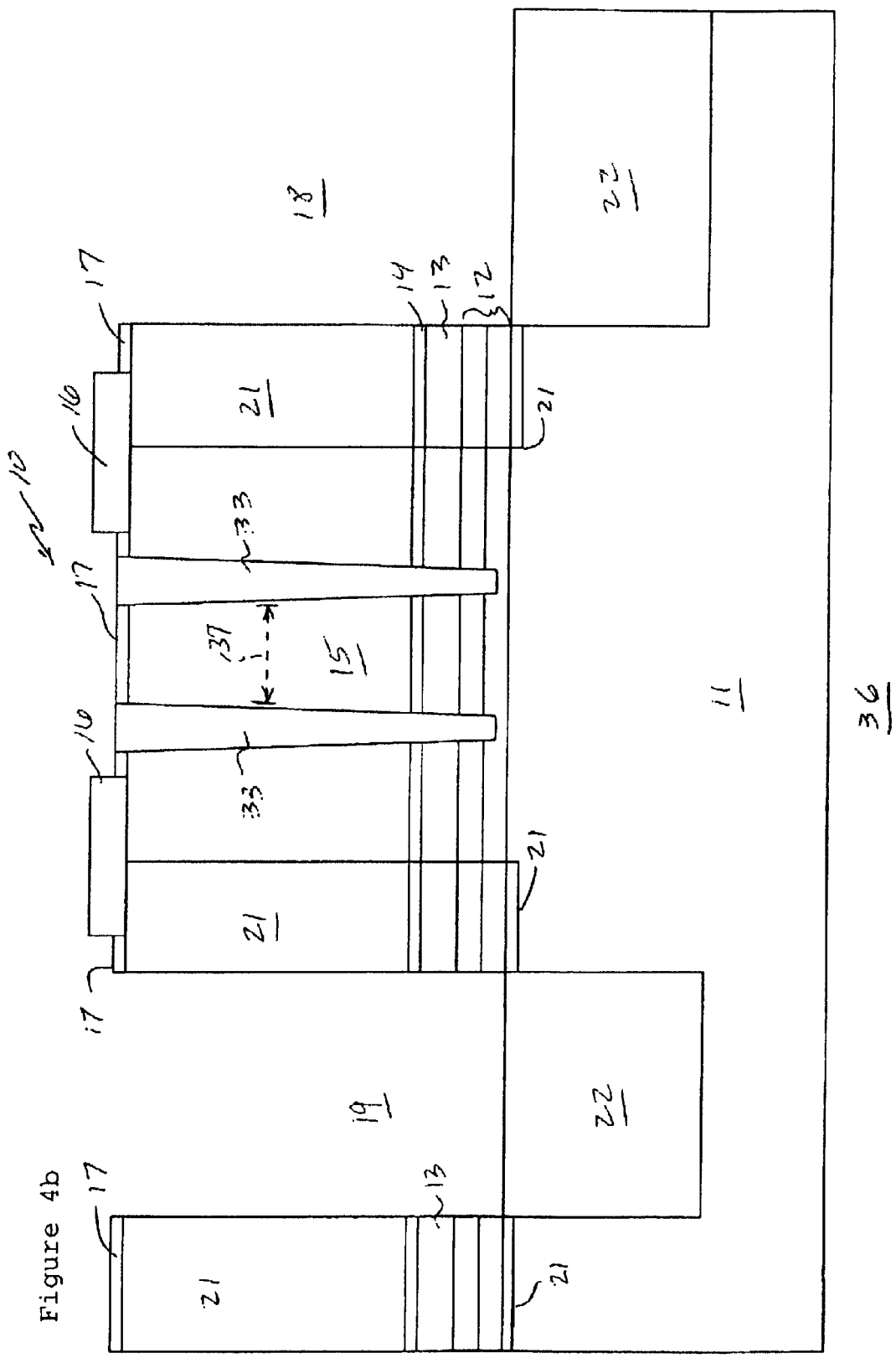
FIG. 4b shows a cross-section of several interior trenches on the VCSEL device.
Figure 5:
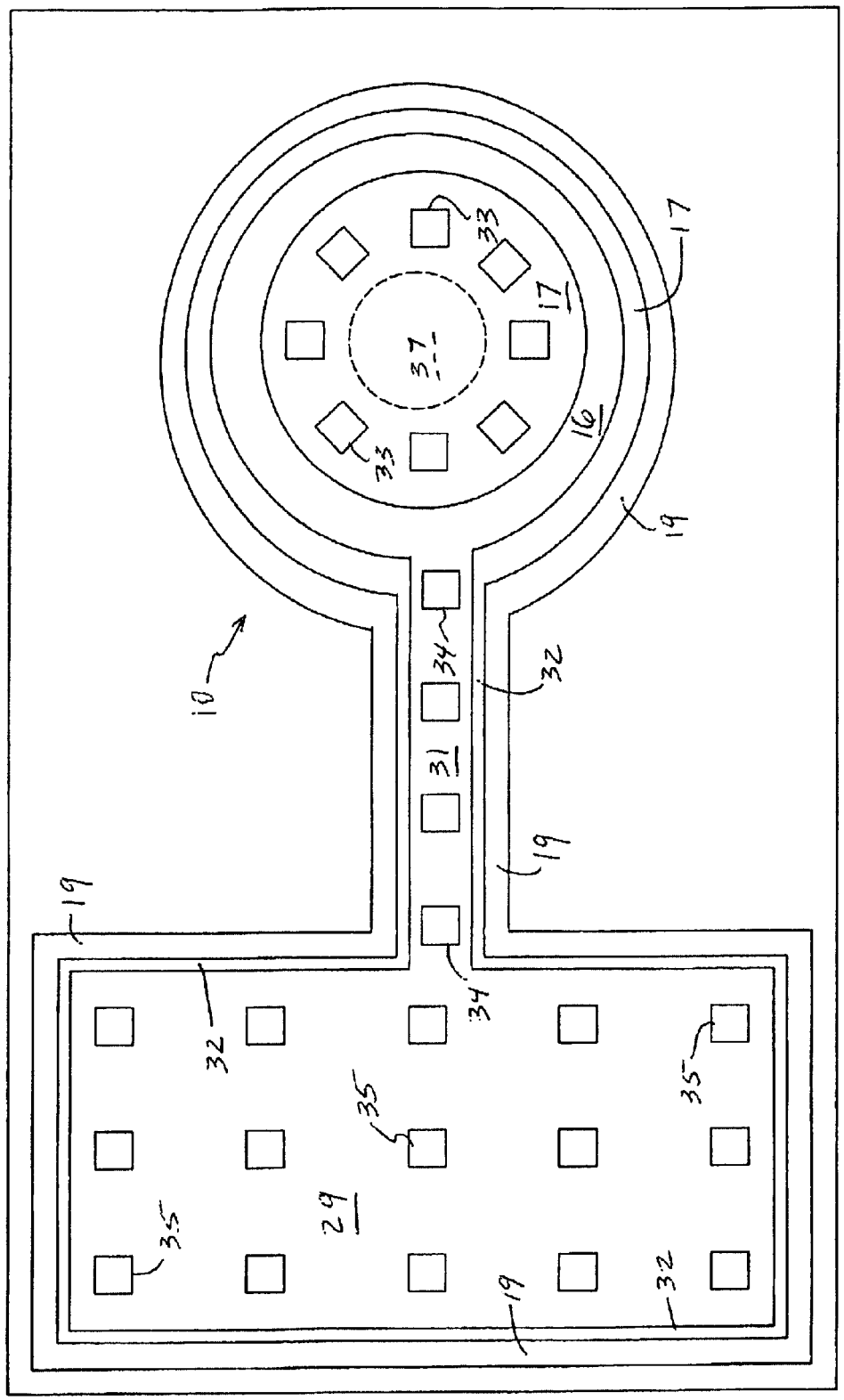
FIG. 5 shows a bonding pad and the connecting bridge to a VCSEL also having interior oxidation trenches.

FIG. 4a reveals VCSEL 10 having interior oxidation trenches 33. VCSEL 30 of FIG. 2 may also have trenches 33. FIG. 4b is a cross-section of trenches 33 which extend through top mirror 15, tunnel junction 14 and oxidizable layer 13 having, for example, a high content of aluminum. Trenches 33 may extend into or past active area 12. Trenches 33 enable oxidation in various layers, particularly layer 13, having a high proportion of aluminum or other easily oxidizable material, to better provide isolation for tunnel junction 14 and current confinement. Trenches 33 may define aperture 37.

FIG. 5 shows not only interior trenches 33 of VCSEL 10 but also trenches 34 along connecting bridge 31 and trenches 35 in pad 29. The layers from mirror 15 of VCSEL 10 down to substrate 36 may be present through that portion of pad 29 and bridge 31. Thus, trenches 34 and 35 may go down to oxidizable layer 13. Trenches 34 and 35 may enable oxidation in layer 13 under pad 29 and bridge 31 for some isolation of the pad and connecting bridge. In an illustrative example, the trenches may be about 4 by 4 microns wide and be from 10 to 20 microns apart from one another. The bridge may or may not be present.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A VCSEL comprising:
    a substrate;
    a first mirror above said substrate;
    an active region above said first mirror;
    a tunnel junction above said active region;
    a second mirror above said tunnel junction; and
    an isolation implant in a portion of said second mirror, tunnel junction and active region.

2. The VCSEL of claim 1, having an island that comprises said active region, tunnel junction and second mirror.

3. The VCSEL of claim 2, wherein the island substantially isolates said tunnel junction.

4. The VCSEL of claim 1, wherein a trench is situated around a significant portion of said active region, tunnel junction and second mirror.

5. The VCSEL of claim 4, wherein the trench substantially isolates said tunnel junction.

6. The VCSEL of claim 2, wherein the island further comprises a bond pad.

7. The VCSEL of claim 4, wherein the trench is further situated around a substantial portion of the bond pad.

8. The VCSEL of claim 2, wherein said first and second mirrors are N-doped mirrors.

9. The VCSEL of claim 4, wherein said first and second mirrors are N-doped mirrors.

10. The VCSEL of claim 8, further comprising a P-doped region.

11. The VCSEL of claim 10, wherein a peripheral portion of said P-doped region is oxidized.

12. The VCSEL of claim 11, further comprising a plurality of vertical internal trenches.

13. The VCSEL of claim 9, further comprising a P-doped region.

14. The VCSEL of claim 13, wherein a peripheral portion of said P-doped region is oxidized.

15. The VCSEL of claim 14, further comprising a plurality of vertical internal trenches.

16. A VCSEL comprising:
   a substrate;
   a first mirror above said substrate;
   an active region above said first mirror;
   an island isolated tunnel junction above said active region;
   a second mirror above said tunnel junction;
   a buried isolation implant in a portion of said first mirror, tunnel junction, and active region; and
   a third mirror above a first portion of said second mirror.

17. The VCSEL of claim 16, further comprising at least one layer between said island isolated tunnel junction and active region, wherein said at least one layer is substantially oxidized about its peripheral region.

18. The VCSEL of claim 17, further comprising a plurality of vertical internal trenches.

19. The VCSEL of claim 18 further comprising a conductive contact above a second portion of said second mirror.

20. A VCSEL comprising:
   a first mirror;
   an active region above said mirror;
   an oxide region above said active region; and
   a second mirror above said oxide region;
   a trench extending through said second mirror, said oxide region and at least part of said active region, said trench having a bottom; and
   an isolation implant region extending down from the bottom of the trench.

21. The VCSEL of claim 20, wherein said first mirror is above a substrate.

22. The VCSEL of claim 21, wherein said second mirror, said oxide region and at least part of said active region form an island.

23. The VCSEL of claim 22, wherein said second mirror has an isolation implant in a peripheral portion.

24. The VCSEL of claim 23, further comprising a conductive contact formed above said second mirror.

25. The VCSEL of claim 24, wherein said first and second mirrors are N-doped.

26. The VCSEL of claim 25, wherein said active region has at least one quantum well.

27. The VCSEL of claim 26, wherein said first mirror has an isolation implant in a peripheral portion beyond said island and extending from the bottom of the trench.

28. The VCSEL of claim 27, further comprising a conductive pad having a connection said conductive contact.

29. The VCSEL of claim 28, wherein said conductive pad is on a material at a level of a top of said island.

30. The VCSEL of claim 21, further comprising a tunnel junction above said active region, and said trench also extends through said tunnel junction.

31. The VCSEL of claim 30, wherein said second mirror has an isolation implant in a peripheral portion.

32. The VCSEL of claim 31, wherein said first and second mirrors are N-doped.

33. The VCSEL of claim 32, wherein said oxide region is P-doped.

34. The VCSEL of claim 33, wherein said oxide region has oxidized material in a peripheral portion of said oxide region.

35. The VCSEL of claim 34, wherein said active region has at least one quantum well.

36. The VCSEL of claim 35, further comprising a conductive contact on a peripheral portion of a top surface of said second mirror.

37. The VCSEL of claim 36, further comprising a conductive pad having a bridge connected to said conductive contact.

38. The VCSEL of claim 37 including a trench that extends around a portion of a periphery of said conductive pad and bridge.

39. The VCSEL of claim 38, wherein said conductive pad and bridge are above an isolation implanted material of said second mirror.

40. The VCSEL of claim 39, wherein said bridge is above a planarizing material over a portion of the trench at the periphery of said first mirror, said tunnel junction, said oxide region and said active region.

41. The VCSEL of claim 39, wherein said conductive pad and bridge are above a dielectric material.

42. The VCSEL of claim 39, including at least one trench through said second mirror, said tunnel junction and at least said oxide region within the peripheral portion of the isolation implant.

43. The VCSEL of claim 39 including a plurality of trenches through said conductive pad and bridge, material of said second mirror, tunnel diode and oxide region.

44. A VCSEL comprising:
   a first mirror;
   an active region above said first mirror;
   an oxidation region above said active region;
   a tunnel junction above said oxidation region;
   a first part of a second mirror above said tunnel junction;
   an implant on a peripheral portion of the first part of said second mirror, said tunnel junction, and at least part of said active region; and
   a second part of said second mirror above the first part of said second mirror.

45. The VCSEL of claim 44, wherein said first and second mirrors are n-doped.

46. The VCSEL of claim 45, wherein said oxidation layer is P-doped.

47. The VCSEL of claim 46, wherein the second part of said second mirror forms a island above the first part of said second mirror.

48. The VCSEL of clam 47, wherein said active region, oxidation region, tunnel junction and second mirror form an island.

49. The VCSEL of claim 47, wherein a peripheral trench at least partially surrounds the first part of said second mirror and said tunnel junction.

50. The VCSEL of claim 48, further comprising a conductive contact above the first part of said second mirror.

51. The VCSEL of claim 50, further comprising:
   a conductive pad; and
   a bridge connecting said conductive pad to said conductive contact.

52. The VCSEL of claim 51, wherein said conductive pad and bridge are on a planarized material.

53. The VCSEL of claim 52, wherein the planarized material is above an isolation implanted material.

54. The VCSEL of claim 53 further comprising at least one vertical trench through at least a portion of said second mirror, said tunnel junction and said oxidation region.

55. The VCSEL of claim 49, further comprising a conductive contact above the first part of said second mirror.

56. The VCSEL of claim 55, further comprising:
   a conductive pad; and
   a bridge connecting said conductive pad to said conductive contact.

57. The VCSEL of claim 56, wherein said conductive pad and bridge are above an implanted material.

58. The VCSEL of claim 57, wherein a dielectric material is situated between said conductive pad and the implanted material and between said bridge and the implanted material.

59. The VCSEL of claim 58, further comprising a plurality of vertical trenches in said conductive pad and bridge, wherein each of said vertical trenches goes from said conductive pad and bridge to an oxidation layer.

60. The VCSEL of claim 59, wherein said peripheral trench is planarized with a material.

61. The VCSEL of claim 60, further comprising at least one vertical trench through at least a portion of said second mirror, said tunnel junction and said oxidation layer.

62. A VCSEL comprising:
   first means for reflecting;
   means for converting current to light above said first means for reflecting;
   means for confining with oxidation above said means for converting current to light;
   mean for tunneling above said means for confining;
   second means for reflecting above said means for tunneling; and
   mean for implant isolating in at least a portion of the periphery of said means for converting current to light.

63. The VCSEL of claim 62, wherein:
   said first and second means for reflecting are N-doped; and
   said means for confining is P-doped.

* * * * *